(12) United States Patent
Liu

(10) Patent No.: US 12,089,334 B2
(45) Date of Patent: Sep. 10, 2024

(54) DISPLAY PANEL AND DISPLAY DEVICE

(71) Applicant: TCL China Star Optoelectronics Technology Co., Ltd., Guangdong (CN)

(72) Inventor: Jinfeng Liu, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 563 days.

(21) Appl. No.: 17/426,125

(22) PCT Filed: May 31, 2021

(86) PCT No.: PCT/CN2021/097530
§ 371 (c)(1),
(2) Date: Jul. 28, 2021

(87) PCT Pub. No.: WO2022/198793
PCT Pub. Date: Sep. 29, 2022

(65) Prior Publication Data
US 2023/0371184 A1   Nov. 16, 2023

(30) Foreign Application Priority Data
Mar. 25, 2021   (CN) .......................... 202110319391.3

(51) Int. Cl.
*H05K 1/00*   (2006.01)
*H05K 1/02*   (2006.01)
(Continued)

(52) U.S. Cl.
CPC .............. *H05K 1/18* (2013.01); *H05K 1/028* (2013.01); *H05K 1/11* (2013.01); *H05K 1/142* (2013.01);
(Continued)

(58) Field of Classification Search
CPC . H05K 1/18; H05K 1/028; H05K 1/11; H05K 1/142; H05K 2201/05; H05K 2201/10128; H05K 2201/10212
See application file for complete search history.

(56) References Cited

U.S. PATENT DOCUMENTS 11,056,424 B2 * 7/2021 Lee .................. H05K 1/147
11,256,308 B2 * 2/2022 Fujikawa ............. G06F 1/189
(Continued)

FOREIGN PATENT DOCUMENTS

CN   101315508   12/2008
CN   101322170   12/2008
(Continued)

OTHER PUBLICATIONS

Go (KR 20200013202A; English Translation; published in Feb. 2, 2020) (Year: 2020).*

*Primary Examiner* — Pete T Lee

(57) ABSTRACT

The present application discloses a display panel and a display device. The display panel includes a display panel main body, a flexible wiring board, and a printed circuit board. The display panel main body includes a plurality of wires, and the display panel main body is connected to an end of the flexible wiring board. The printed circuit board is connected to another end of the flexible wiring board. The printed circuit board includes a driver chip, and the driver chip is electrically connected to the wires.

8 Claims, 12 Drawing Sheets

(51) Int. Cl.
  *H05K 1/11* (2006.01)
  *H05K 1/14* (2006.01)
  *H05K 1/18* (2006.01)

(52) U.S. Cl.
  CPC .................... *H05K 2201/05* (2013.01); *H05K 2201/10128* (2013.01); *H05K 2201/10212* (2013.01)

(56) References Cited

U.S. PATENT DOCUMENTS

| | | | |
|---|---|---|---|
| 2014/0153266 A1* | 6/2014 | Kim | G09F 9/301 362/418 |
| 2019/0019855 A1* | 1/2019 | Park | G02F 1/13338 |
| 2020/0312761 A1* | 10/2020 | Jang | H01L 23/4985 |

FOREIGN PATENT DOCUMENTS

| | | |
|---|---|---|
| CN | 101425281 | 5/2009 |
| CN | 106226963 | 12/2016 |
| CN | 106601166 | 4/2017 |
| CN | 107741677 | 2/2018 |
| CN | 208027056 | 10/2018 |
| CN | 109559644 | 4/2019 |
| CN | 110890062 | 3/2020 |
| CN | 110910766 | 3/2020 |
| CN | 111402754 | 7/2020 |
| CN | 111599302 | 8/2020 |
| JP | 2003-337550 | 11/2003 |
| KR | 10-2013-0039186 | 4/2013 |

* cited by examiner

DISPLAY PANEL AND DISPLAY DEVICE

RELATED APPLICATIONS

This application is a National Phase of PCT Patent Application No. PCT/CN2021/097530 having International filing date of May 31, 2021, which claims the benefit of priority of Chinese Patent Application No. 202110319391.3 filed on Mar. 25, 2021. The contents of the above applications are all incorporated by reference as if fully set forth herein in their entirety.

FIELD AND BACKGROUND OF THE INVENTION

The present application relates to a field of display technologies, especially to a display panel and a display device including the display panel.

Popularity of mobile products and large screen displays has promoted the rapid development of low-cost, high-density, and mass-quantity electronic production technologies. Large-sized electronic products such as liquid crystal display, liquid crystal TV, and plasma TV, and small and medium-sized electronic products such as mobile phones, digital cameras, etc. are all based on development trends of lightness, thinness, and compactness, which require a new generation of packaging technologies with high density, small size, and free installation to match the above requirements. A chip on film (COF) encapsulation technology is born accordingly. Such technology is a die-flexible-film fabrication technology. It uses a flexible circuit board as a chip encapsulation carrier for bonding the chip to a flexible substrate circuit.

With reference to FIG. 1, FIG. 1 is a schematic structural view of a conventional COF-type display device. The display device comprises a display panel main body 1, a chip on film 2 including an end bonded and connected to the display panel main body 1, a circuit board 4 bonded and connected to another end of the chip on film 2, and a driver chip 3 bonded to the chip on film 2. Because different driver chips 3 may need to transmit different signals into the display panel main body 1, different chip on films 2 need to transmit signals corresponding to the driver chips 3 disposed on the chip on films 2 such that different chip on films 2 may need to transmit specific signals, and specific internal wires need to be disposed in a region of the display panel main body 1 connected to the chip on films 2 to receive the specific signals. For example, usually transmission of scan signals is performed on chip on films 2 on left and right sides. Therefore, scan signal wires are required to be concentratedly disposed on left and right sides of the display panel main body 1 to correspond to the chip on films 2 on the left and right sides, which increases a frame width of the display panel main body 1 and is disadvantageous to a narrow frame display. Furthermore, a layout of the internal wires in the display panel main body 1 is necessarily restricted by signal transmission on the chip on films 2.

SUMMARY OF THE INVENTION

Technical Issue

The present application embodiment provides a display panel and a display device that can solve the technical issue that because in the conventional technology a driver chip is disposed on a chip on film such that distribution of connection lines on the chip on film is restricted by the driver chip to further influence distribution of internal wires.

Technical Solution

To solve the above technical issue, the embodiment of the present application further provides a display panel, comprising:
- a display panel main body, comprising a plurality of wires;
- a flexible wiring board, wherein an end of the flexible wiring board is connected to the display panel main body; and
  - a printed circuit board connected to another end of the flexible wiring board, wherein the printed circuit board comprises a driver chip, and the driver chip is electrically connected to the wires.

In an embodiment of the present application, the flexible wiring board comprises a plurality of connection lines, the printed circuit board comprises a plurality of signal lines, each of the connection lines is connected between a corresponding one of the wires and a corresponding one of the signal lines.

In an embodiment of the present application, the signal lines a plurality of first signal lines and a plurality of second signal lines, the wires comprise a plurality of first wires and a plurality of second wires, each of the first signal lines is connected to a corresponding one of the first wires through a corresponding one of the connection lines, each of the second signal lines is connected to a corresponding one of the second wires through a corresponding one of the connection lines, and a signal of each of the first signal lines is different from a signal of each of the second signal lines.

In an embodiment of the present application, the printed circuit board comprises a first layer and a second layer disposed in different layers, at least one of the first signal lines or at least one of the second signal lines comprises a first section located in the first layer and a second section located in the second layer, the first section is connected between the driver chip and the second section, and the second section is connected between a corresponding one of the connection lines and the first section.

In an embodiment of the present application, at least one of the first signal lines or at least one of the second signal lines further comprises a third section located in the first layer, and the third section is connected between a corresponding one of the connection lines and the second section.

In an embodiment of the present application, the first signal lines are connected to a first side of the driver chip, the first sections of the second signal lines are connected to a second side of the driver chip disposed opposite to the first side and are arranged along a first direction, the third sections of the second signal lines are arranged along a second direction, the first direction is a direction pointing from the flexible wiring board to the driver chip, the second direction is a direction pointing from the second side of the driver chip to the first side, and the first direction is perpendicular to the second direction; and
  wherein a length of the third section in the second signal lines near the first side is less than a length of the third section in the second signal lines away from the first side, a length of the second section connected to the third section near the first side is greater than a length of the second section connected to the third section away from the first side, and a length of the first section connected to the third section near the first side is greater than a length of the first section connected to the third section away from the first side.

In an embodiment of the present application, a plurality of first signal line sets and a plurality of second signal line sets are arranged alternately along a second direction, wherein each of the first signal line sets comprises the third section of at least one of the first signal lines, and each of the second signal line sets comprises the third section of at least one of the second signal lines.

In an embodiment of the present application, numbers of the third sections of the first signal lines in the first signal line sets are equal, and numbers of the third sections of the second signal lines in the second signal line sets are equal.

In an embodiment of the present application, numbers of the third sections of the first signal lines in the first signal line sets are gradually increased or decreased along the second direction, and numbers of the third sections of the second signal lines in the second signal line sets are gradually increased or decreased along the second direction.

According to the above objective of the present application, a display device is provided, the display device comprises a display panel, and the display panel comprises:
- a display panel main body, comprising a plurality of wires;
- a flexible wiring board, wherein an end of the flexible wiring board is connected to the display panel main body; and
- a printed circuit board connected to another end of the flexible wiring board, wherein the printed circuit board comprises a driver chip, and the driver chip is electrically connected to the wires.

In an embodiment of the present application, the flexible wiring board comprises a plurality of connection lines, the printed circuit board comprises a plurality of signal lines, each of the connection lines is connected between a corresponding one of the wires and a corresponding one of the signal lines.

In an embodiment of the present application, the signal lines comprise a plurality of first signal lines and a plurality of second signal lines, the wires comprise a plurality of first wires and a plurality of second wires, each of the first signal lines is connected to a corresponding one of the first wires through a corresponding one of the connection lines, each of the second signal lines is connected to a corresponding one of the second wires through a corresponding one of the connection lines, and a signal of each of the first signal lines is different from a signal of each of the second signal lines.

In an embodiment of the present application, the printed circuit board comprises a first layer and a second layer disposed in different layers, at least one of the first signal lines or at least one of the second signal lines comprises a first section located in the first layer and a second section located in the second layer, the first section is connected between the driver chip and the second section, and the second section is connected between a corresponding one of the connection lines and the first section.

In an embodiment of the present application, at least one of the first signal lines or at least one of the second signal lines further comprises a third section located in the first layer, and the third section is connected between a corresponding one of the connection lines and the second section.

In an embodiment of the present application, the first signal lines are connected to a first side of the driver chip, the first sections of the second signal lines are connected to a second side of the driver chip disposed opposite to the first side and are arranged along a first direction, the third sections of the second signal lines are arranged along a second direction, the first direction is a direction pointing from the flexible wiring board to the driver chip, the second direction is a direction pointing from the second side of the driver chip to the first side, and the first direction is perpendicular to the second direction; and wherein a length of the third section in the second signal lines near the first side is less than a length of the third section in the second signal lines away from the first side, a length of the second section connected to the third section near the first side is greater than a length of the second section connected to the third section away from the first side, and a length of the first section connected to the third section near the first side is greater than a length of the first section connected to the third section away from the first side.

In an embodiment of the present application, a plurality of first signal line sets and a plurality of second signal line sets are arranged alternately along a second direction, wherein each of the first signal line sets comprises the third section of at least one of the first signal lines, and each of the second signal line sets comprises the third section of at least one of the second signal lines.

In an embodiment of the present application, numbers of the third sections of the first signal lines in the first signal line sets are equal, and numbers of the third sections of the second signal lines in the second signal line sets are equal.

In an embodiment of the present application, numbers of the third sections of the first signal lines in the first signal line sets are gradually increased or decreased along the second direction, and numbers of the third sections of the second signal lines in the second signal line sets are gradually increased or decreased along the second direction.

Advantages

Compared to the prior art, the present application, by disposing the driver chip on the printed circuit board and electrically connecting the driver chip to the wires in the display panel main body, achieves signal transmission. The present application disposes the driver chip on the printed circuit board such that, by adjusting and designing an arrangement of signal lines on the printed circuit board, distribution of the wires can be no longer restricted due to different signals transmitted by driver chips on different flexible wiring boards, which improves flexibility of the distribution of the wires.

BRIEF DESCRIPTION OF THE SEVERAL VIEWS OF THE DRAWINGS

Specific embodiments of the present invention are described in details with accompanying drawings as follows to make technical solutions and advantages of the present invention clear.

DESCRIPTION OF SPECIFIC EMBODIMENTS OF THE INVENTION

Figure 1:
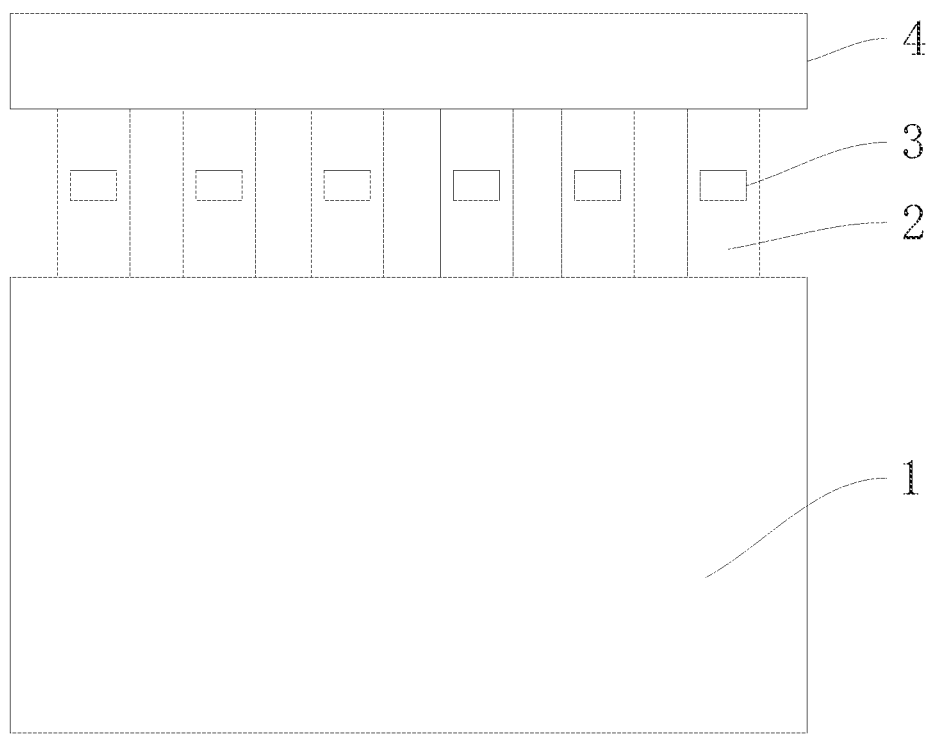
FIG. 1 is a schematic structural view of a conventional display panel.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

The following disclosure provides many different embodiments or examples to achieve different structures of the present application. To simplify the disclosure of the present application, the components and arrangements of the specific examples are described below. Of course, they are merely examples, and the purpose is not to limit the present application. Furthermore, the present application may repeat reference numerals and/or reference letters in different examples. The repetition is for the purpose of simplification and clarity, and does not by itself indicate the relationship between the various embodiments and/or settings discussed. In addition, the present application provides examples of various specific processes and materials, but a person of ordinary skill in the art can be aware of the application of other processes and/or the use of other materials.

With reference to FIG. 1, FIG. 1 is a schematic structural view of a conventional COF-type display panel. The display panel comprises a display panel main body 1, a chip on film 2 including an end bonded and connected to the display panel main body 1, a circuit board 4 connected to another end of the chip on film 2, and a driver chip 3 bonded to the chip on film 2. Because different driver chips 3 might need to transmit signals into the display panel main body 1, different chip on films 2 need to transmit signals corresponding to the driver chips 3 disposed thereon, which results in that different chip on films 2 might need to transmit specific signals, and internal wires need to be disposed in a region of the chip on film 2 connected to the display panel main body 1 to receive the specific signals. For example, generally, chip on films 2 on left and right sides perform transmission of scan signal, and therefore scan signal wires are concentratedly disposed on left and right sides of the display panel main body 1 to correspond to the chip on films 2 of the left and right sides, which increases a frame width of the display panel main body 1 and is disadvantageous to a narrow frame display. Furthermore, a layout of the internal wires in the display panel main body 1 is necessarily restricted by signal transmission on the chip on film 2.

Figure 2:
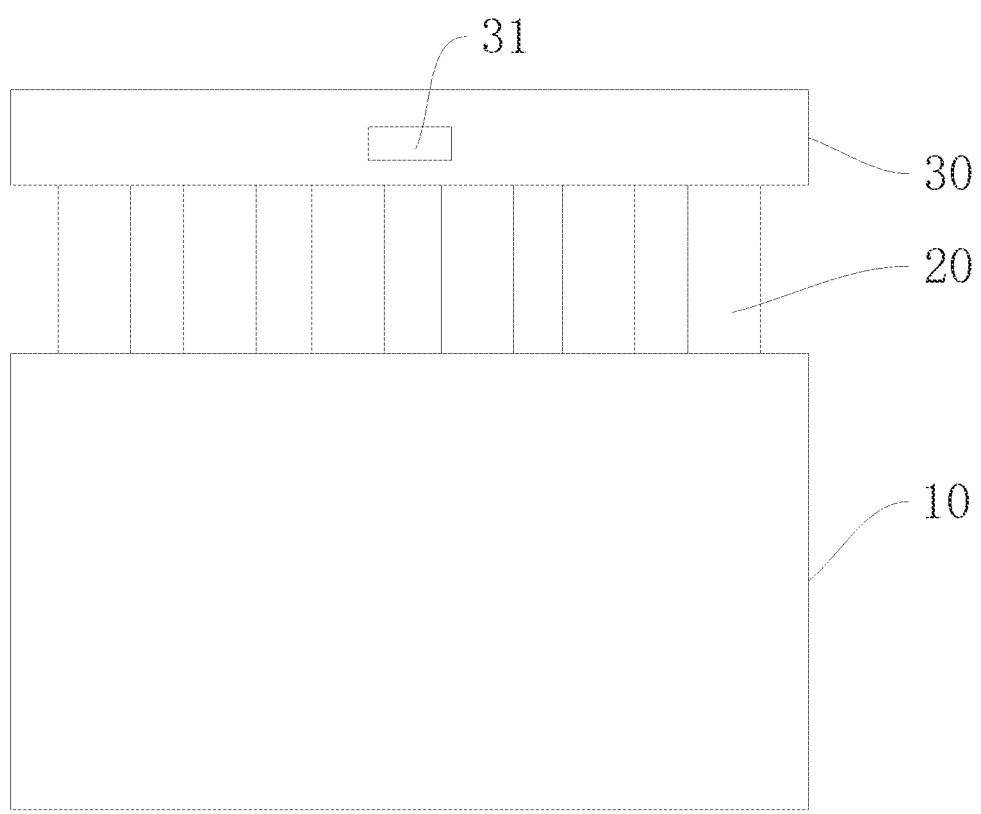
FIG. 2 is a schematic structural view of a display panel provided by an embodiment of the present application.
Figure 3:
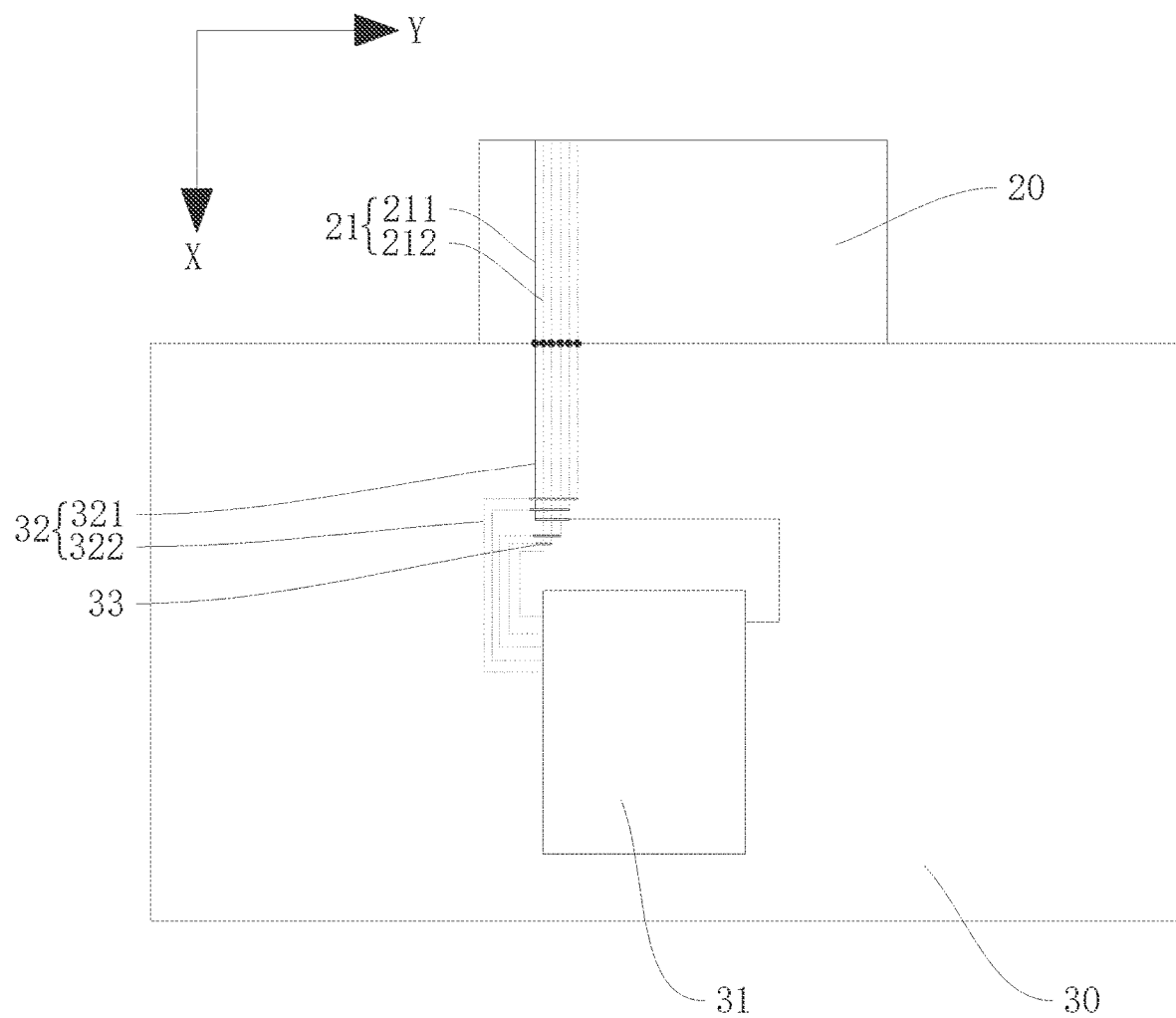
FIG. 3 is a schematic structural view of a wiring layout of a printed circuit board and a flexible wiring board provided by an embodiment of the present application.
Figure 4:
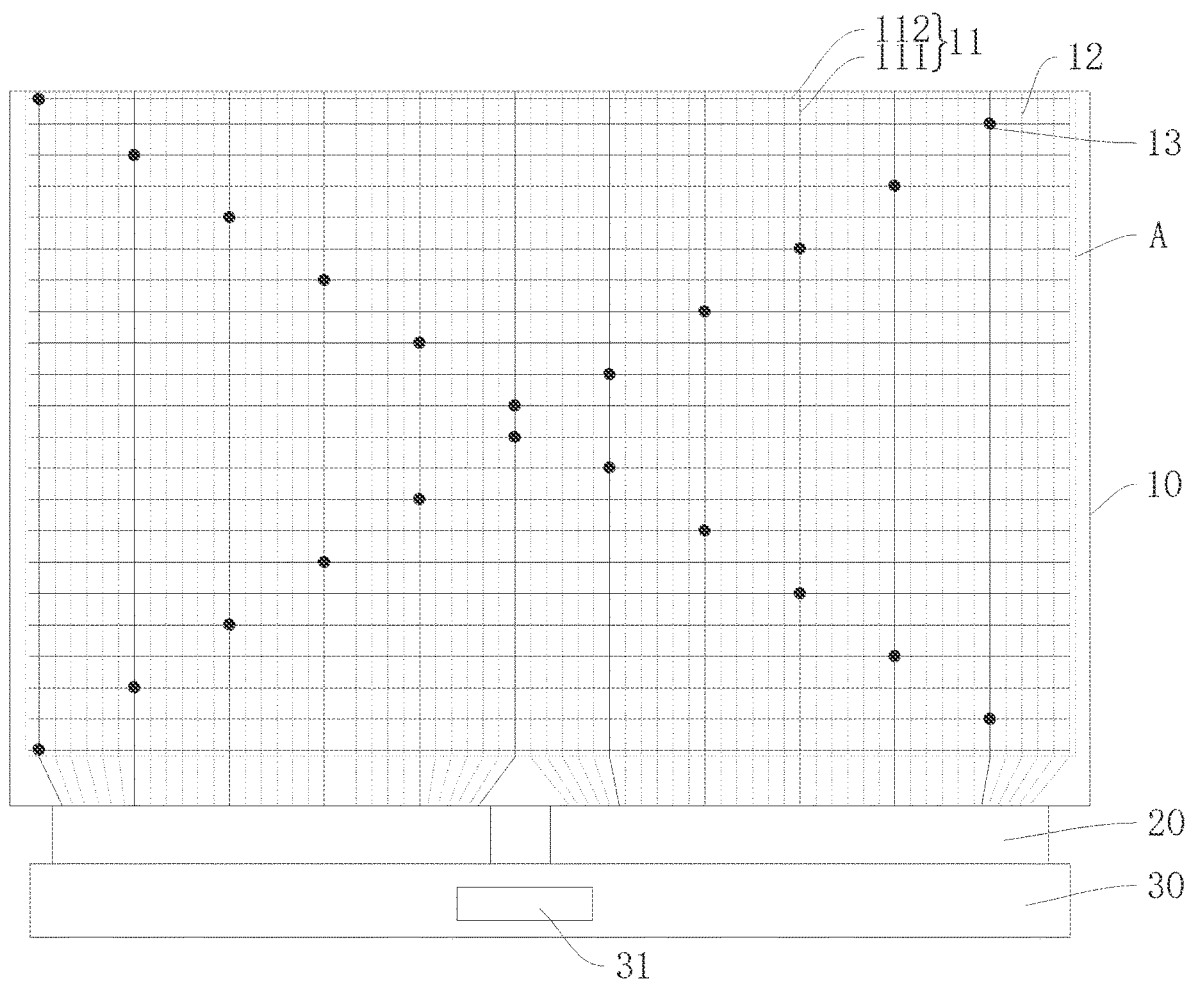
FIG. 4 is a schematic structural view of a wiring layout of a display panel main body provided by an embodiment of the present application.

With reference to FIGS. 2, 3, and 4, the embodiment of the present application provides a display panel, and the display panel comprises: a display panel main body 10, a flexible wiring board 20, and a printed circuit board 30. The display panel main body 10 comprises a plurality of wires. An end of the flexible wiring board 20 is connected to the display panel main body 10, and another end of the flexible wiring board 20 is connected to the printed circuit board 30. The printed circuit board 30 comprises a driver chip 31, and the driver chip 31 is electrically connected to the wires.

During application, the embodiment of the present application disposes the driver chip 31 on the printed circuit board 30, and the flexible wiring board 20 is only configured to transmit signals and would not limit types of signal transmission such that the wiring layout is no longer limited by different signals transmitted on different flexible wiring boards 20, which improves flexibility of the wiring layout.

With reference to FIGS. 2, 3, and 4, the display panel provided by the embodiment of the present application comprises a display panel main body 10, a flexible wiring board 20, and a printed circuit board 30. A number of the flexible wiring board 20 can be one or plural, and an end of each flexible wiring board 20 is connected to the display panel main body 10, another end of the flexible wiring board 20 is connected to the printed circuit board 30. Furthermore, a driver chip 31 is disposed on the printed circuit board 10 and is configured to transmit a signal and to transmit the signal to the display panel main body 10 through the flexible wiring board 20 to achieve a display or light emitting function.

Furthermore, the display panel main body 10 comprises a plurality of wires. A plurality of connection lines 21 are disposed on the flexible wiring board 20. a plurality of signal lines 32 are disposed on the printed circuit board 30, and each of the connection lines 21 is connected between a corresponding one of the signal lines 32 and a corresponding one of the wires. Optionally, the wires are connected correspondingly to the connection lines 21, and the connection lines 21 are connected correspondingly to the signal lines 32.

The signal lines 32 comprise a plurality of first signal lines 321 and a plurality of second signal lines 322, and the first signal lines 321 and the second signal lines 322 transmit signals of different types. Optionally, scan signals are transmitted in the first signal lines 321, and data signals are transmitted in the second signal lines 322. Alternatively, data signals are transmitted in the first signal lines 321, and scan signals are transmitted in the second signal lines 322. Alternatively, the first signal lines 321 and the second signal lines 322 transmit signals other than scan signals and data signals respectively, which is not limited here. Furthermore, the first signal lines 321 are connected to a first side of the driver chip 31, the second signal lines 322 are connected to a second side of the driver chip 31. The first side and the second side are located on two opposite sides of the driver chip 31, respectively.

Each of the signal lines 32 comprises a first section near the driver chip 31, a third section near flexible wiring board 20, and a second section connected between the first section and the third section. Namely, each of the signal lines 32 comprises a first section connected between the driver chip 31 and the second section, and a third section connected between the second section and a corresponding one of the connection lines 21. The first section is arranged along a first direction X, the third section is arranged along a second direction Y, and the second section is connected between the first section and the third section. A certain bending arrangement can be implemented according to an arrangement of the signal lines. The first direction X is a direction pointing from the flexible wiring board 20 to the driver chip 31, the second direction Y is a direction pointing from the second side of the driver chip 31 to the first side of the driver chip 31, and in the embodiment of the present application, the first direction X is perpendicular to the second direction Y.

The printed circuit board 30 comprises a first layer and a second layer disposed in different layers, an insulation layer can be disposed between the first layer and the second layer to isolate the first layer from the second layer. The first sections of the first signal lines 321 and the first sections of the second signal lines 322 can be located individually in the first layer or the second layer, the second sections of the first signal lines 321 and the second sections of the second signal lines 322 can also be located individually in the first layer or the second layer, or some of the second sections of the first signal lines 321 and the second sections of the second signal lines 322 are located partially in the first layer and some others of the second sections of the first signal lines 321 and the second sections of the second signal lines 322 are located partially in the second layer. The third sections of the first signal lines 321 and the third sections of the second signal lines 322 are located simultaneously in the first layer or the second layer. Namely, the third sections of the first signal lines 321 and the third sections of the second signal lines 322 are converged in the same layer, and then are connected to the connection lines 21 in the flexible wiring board 20 for signal transmission.

As described above, the embodiment of the present application can further adjust and change the wiring layout by adjusting and designing the arrangement of the signal lines 32 on the printed circuit board 30 to improve flexibility of the wiring layout.

The first signal line sets are set to comprise the third section of at least one of the first signal lines, the second signal line sets are set to comprise the third section of at least one of the second signal lines, and the first signal line sets and the second signal line sets are arranged alternately along the second direction Y. Namely, the arrangement can be the first signal line set, the second signal line set, the first signal line set, the second signal line set, sequentially arranged along the second direction.

The arrangement of the signal lines 32 on the printed circuit board 30 can be adjusted by adjusting a number of the third sections of the first signal lines 321 in each of the first signal line sets and a number of the third sections of the second signal lines 322 in each of the second signal line sets to further adjust the arrangement of the wires in the display panel main body 10.

Optionally, the first signal line set comprises the third sections of the first signal lines 321 of number n, the second signal line set comprises the third sections of the second signal lines 322 of number m. Both n, m are positive integers, and n and m can be equal or unequal. Namely, the third sections of the first signal lines 321 of a number n and the third sections of the second signal lines 322 of a number m are distributed alternately along the second direction Y.

Optionally, the number of the third sections of the first signal lines 321 in the first signal line sets along the second direction Y increases or decreases gradually. The number of the third sections of the second signal lines 322 in the second signal line sets along the second direction Y increases or decreases gradually.

In an embodiment of the present application, with reference to FIG. 3, n is 1 and m is 5, in other words, the number of the third sections of the first signal lines 321 in each of the first signal line sets is the same, and comprises one third section of the first signal line 321. The number of the third sections of the second signal lines 322 in each of the second signal line sets is the same, and comprises five third sections of the second signal lines 322. Furthermore, one of the first signal line sets and one of the second signal line sets are shown in the figure as an example for explanation.

The flexible wiring board 20 comprises first connection lines 211 connected correspondingly to the first signal lines 321 and second connection lines 212 connected correspondingly to the second signal lines 322. Furthermore, an arrangement of the first connection lines 211 and the second connection lines 212 on the flexible wiring board 20 is determined depending on an arrangement of the third sections of the first signal lines 321 and the third sections of the second signal lines 322. In the present embodiment, one first connection line 211 corresponds to five second connection lines 212, and they are arranged alternately along the second direction Y.

In the meantime, with reference to FIG. 4, the display panel main body 10 comprises a plurality of wires, and the wires comprise first wires 11 connected correspondingly to the first connection lines 211 and second wires 12 connected correspondingly to the second connection lines 212. Each of the first wires 11 comprise a first portion 111 and a second portion 112, and the first portion 111 is connected correspondingly to the first connection lines 21. Portions of the first portion 111 and the second wires 12 corresponding to the displaying region A of the display panel main body 10 are distributed to be parallel to each other, portions of the first portion 111 and the second wires 12 corresponding to a non-displaying region can be arranged at a certain included angle with the first direction X to achieve connection of each of the first portion 111 with the corresponding first connection lines 211, connection of each of the second wires 12 with the corresponding second connection lines 212, and electrical connection of the perpendicular second portion 112 and the first portion 111 through a connection point 13. The connection point 13 can be formed by defining a via hole, which is not limited here.

Specifically, in the present embodiment, the first signal lines 321 transmit scan signals, and the second signal lines 322 transmit data signals. Accordingly, by signal transmission of the first connection lines 211 and the second connection lines 212, scan signals are transmitted to the first wires 11, and data signals are transmitted to the second wires 12. Namely, in the present embodiment, the first wires 11 are scan signal wires, and the second wires 12 are data signal wires. The present embodiment, by the arrangement of disposing the first signal lines 321 and the second signal lines 322 on the printed circuit board 30, makes the scan signal wires and the data signal wires in the display panel main body 10 be distributed evenly in the displaying region A instead of being restricted in the display panel main body 10, which achieves flexibility of the wiring layout and can reduce the frame width of the display panel main body 10 to achieve narrow frame display.

Optionally, with reference to FIG. 4, the display panel comprises two flexible wiring boards 20, and a distribution of the first connection lines 211 and the second connection lines 212 on each of the flexible wiring boards 20 is different. It can be understood by connection relationship between the wires and the connection lines 21 and a number of the wires in the figure that the flexible wiring board 20 on a left side has six first connection lines 211 and twenty-five second connection lines 212, and the flexible wiring board 20 on a right side has five first connection lines 211 and thirty second connection lines 212.

Figure 5:
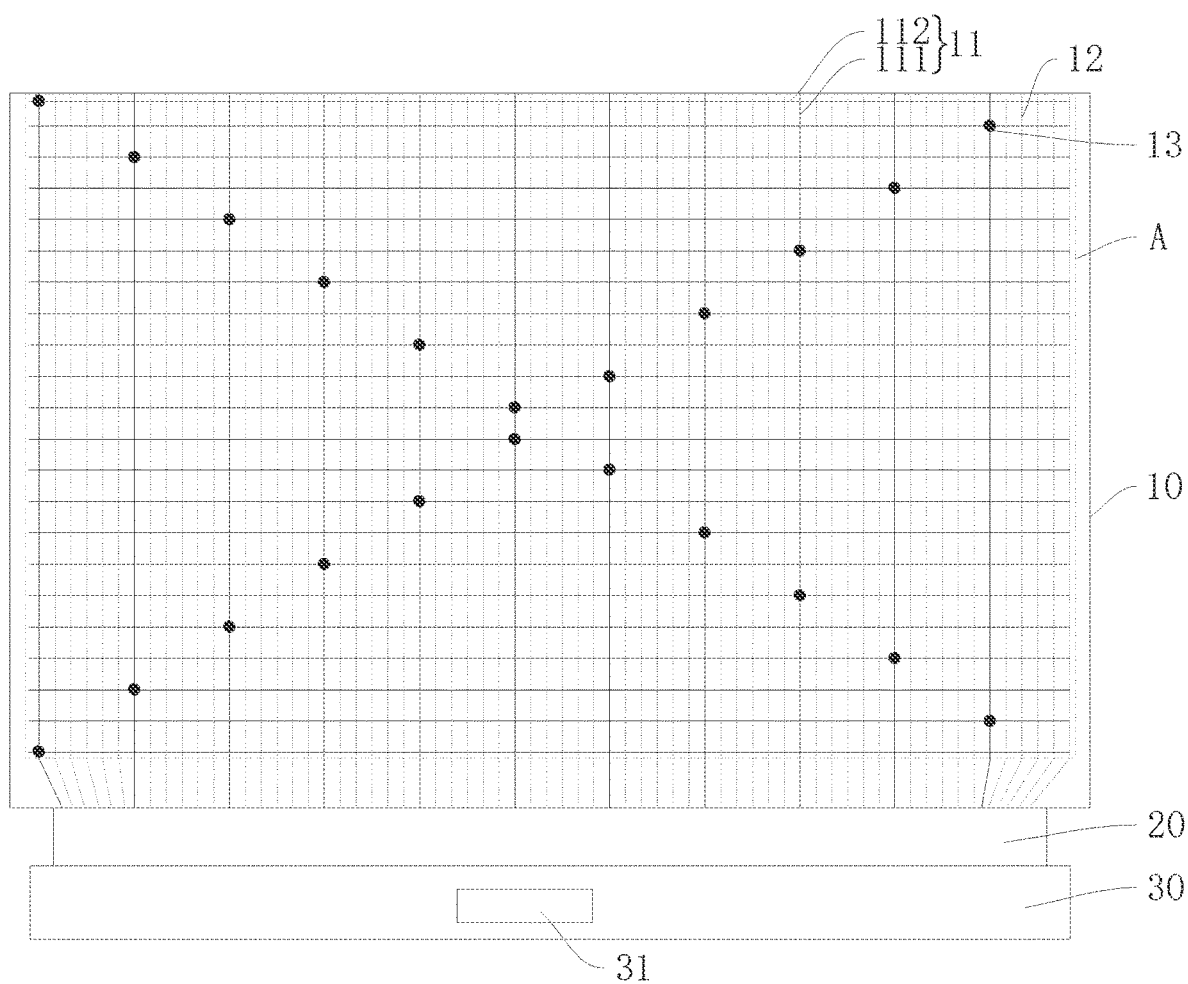
FIG. 5 is a schematic structural view of a wiring layout of another display panel main body provided by an embodiment of the present application.

Optionally, with reference to FIG. 5, the display panel comprises one flexible wiring board 20, namely, eleven first connection lines 211 and fifty-five second connection lines 212 are located on the flexible wiring board 20.

Specifically, the number of the wires provided by the present embodiment are only for explanation and is not limited here, and the number of the flexible wiring board 20 can be single or plural, the number and distribution of the connection lines 21 on each of the flexible wiring board 20 can be the same or different, which is not limited here.

Furthermore, with reference to FIG. 3, the first sections and the third sections of the first signal lines 321 and the first sections and the third sections of the second signal lines 322 are located in the first layer, and the second sections of the first signal lines 321 and the second signal lines 322 are partially located in the first layer and partially located in the second layer. When the second sections of the first signal lines 321 intersect the second sections of the second signal lines 322 during arrangement, connection bridges 33 can be disposed in the second sections to connect the first signal lines 321 and/or the second signal lines 322. Furthermore, the connection bridges 33 are located in the second layer, and each of the connection bridge 33 connects the first signal line 321 or the second signal line 322 by extending through a via hole of the insulation layer.

The third sections of the first signal lines 321 and the third sections of the second signal lines 322 are in the first layer, and are connected to corresponding first connection lines 211 and second connection lines 212 to achieve signal transmission.

Furthermore, a length distribution of the first sections, the second sections, and the third section of the second signal lines 322 during arrangement is as follows. A length of the third section near the first side of the driver chip is less than a length of the third section away from the first side of the driver chip. A length of the second section connected to the third section near the first side of the driver chip is greater than a length of the second section connected to the third section away from the first side of the driver chip. A length of the first section connected to the third section near the first side of the driver chip is greater than a length of the first section connected to the third section away from the first side of the driver chip. As such, for the second signal lines 322 with the shorter third sections, a total length of the second signal lines 322 and other second signal lines 322 can tend to be consistent by increasing lengths of the first sections and the second sections such that resistance of each of the second signal lines 322 tends to be consistent to achieve even signal transmission.

Furthermore, a distribution of lengths of the first signal lines 321 is as follows. A length of the third section near the first side of the driver chip is less than a length of the third section away from the first side of the driver chip. A length of the first section connected to the third section near the first side of the driver chip is greater than a length of the first section connected to the third section away from the first side of the driver chip. As such, for the first signal lines 321 with the shorter third sections, a total length of the first signal lines 321 and other first signal lines 321 can tend to be consistent by increasing lengths of the first section such that resistance of each of the first signal lines 321 tends to be consistent to achieve even signal transmission.

In the present embodiment, the driver chip 31 is disposed on the printed circuit board 30 such that by adjusting and designing the arrangement of the signal lines 32 on the printed circuit board 30 and transmitting signals into the wires through the flexible wiring board 20, distribution of the wires is no longer restricted due to different signals transmitted on different flexible wiring board 20, which improves flexibility of the arrangement of the wires, and simultaneously achieves an effect of reduction of a frame width of the display panel main body 10 to achieve narrow frame display.

Figure 6:
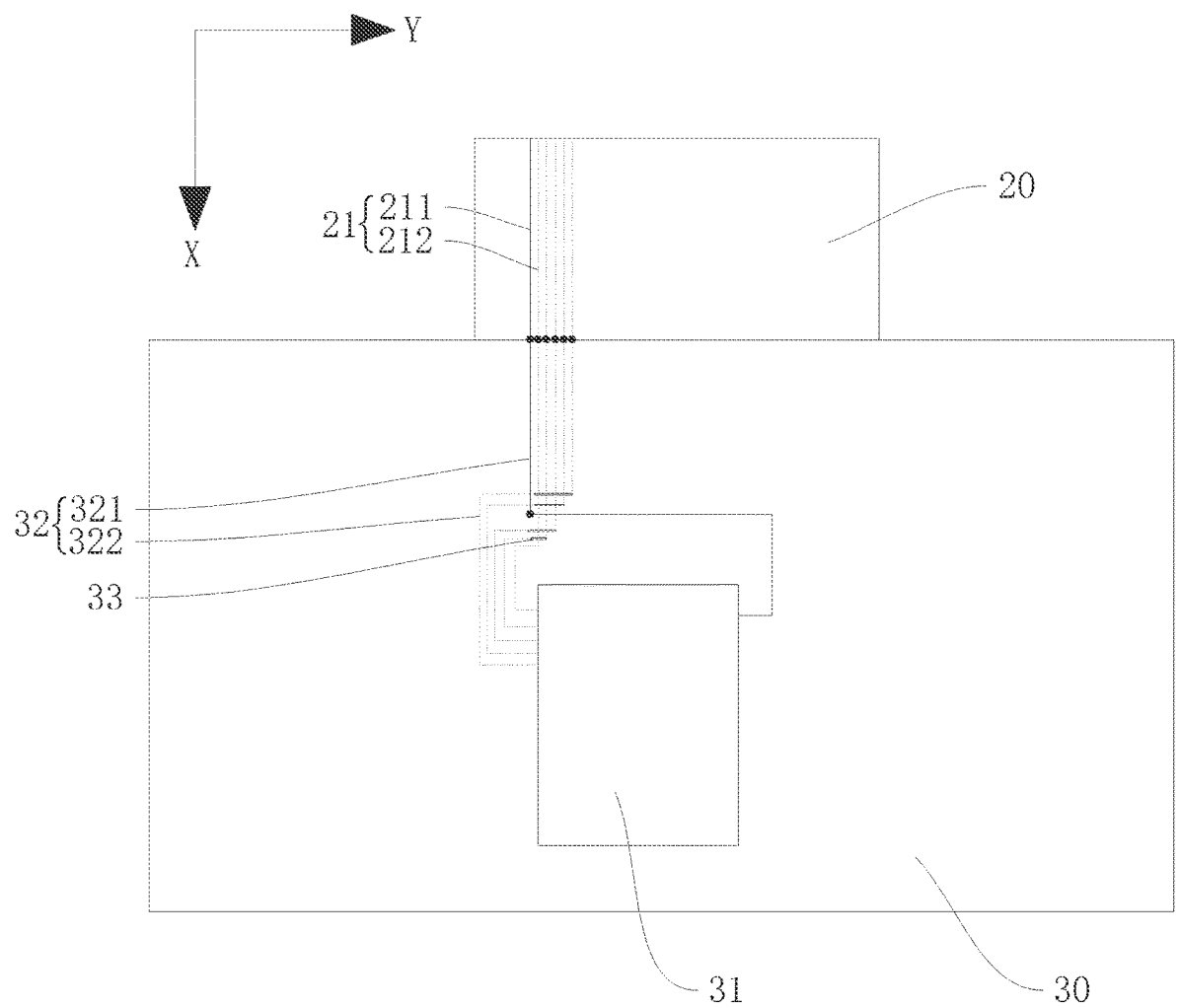
FIG. 6 is a schematic structural view of a wiring layout of another printed circuit board and a flexible wiring board provided by an embodiment of the present application.

In another embodiment of the present application, with reference to FIG. 6, a difference of the present embodiment from the first embodiment is that the first sections and the second sections of the first signal lines 321 are located in the second layer, the third sections of the first signal lines 321 are located in the first layer, and the first sections and the third sections of the second signal lines 322 are located in the first layer. The second sections of the second signal lines 322 intersect each other during an arrangement, at this time, the second signal lines 322 can be connected by disposing connection bridges 33 located in the second layer in the second sections of the second signal lines 322 to prevent intersection of the second signal lines 322 in the same layer.

At the same time, the second sections of the first signal lines 321 are connected to the third sections of the first signal lines 321 by extending through via holes of the insulation layer.

In the present embodiment, the driver chip 31 is disposed on the printed circuit board 30 such that by adjusting and designing the arrangement of the signal lines 32 on the printed circuit board 30 and transmitting signals into the wires through the flexible wiring board 20, distribution of the wires is no longer restricted due to different signals transmitted on different flexible wiring board 20, which improves flexibility of the arrangement of the wires, and simultaneously achieves an effect of reduction of a frame width of the display panel main body 10 to achieve narrow frame display.

Figure 7:
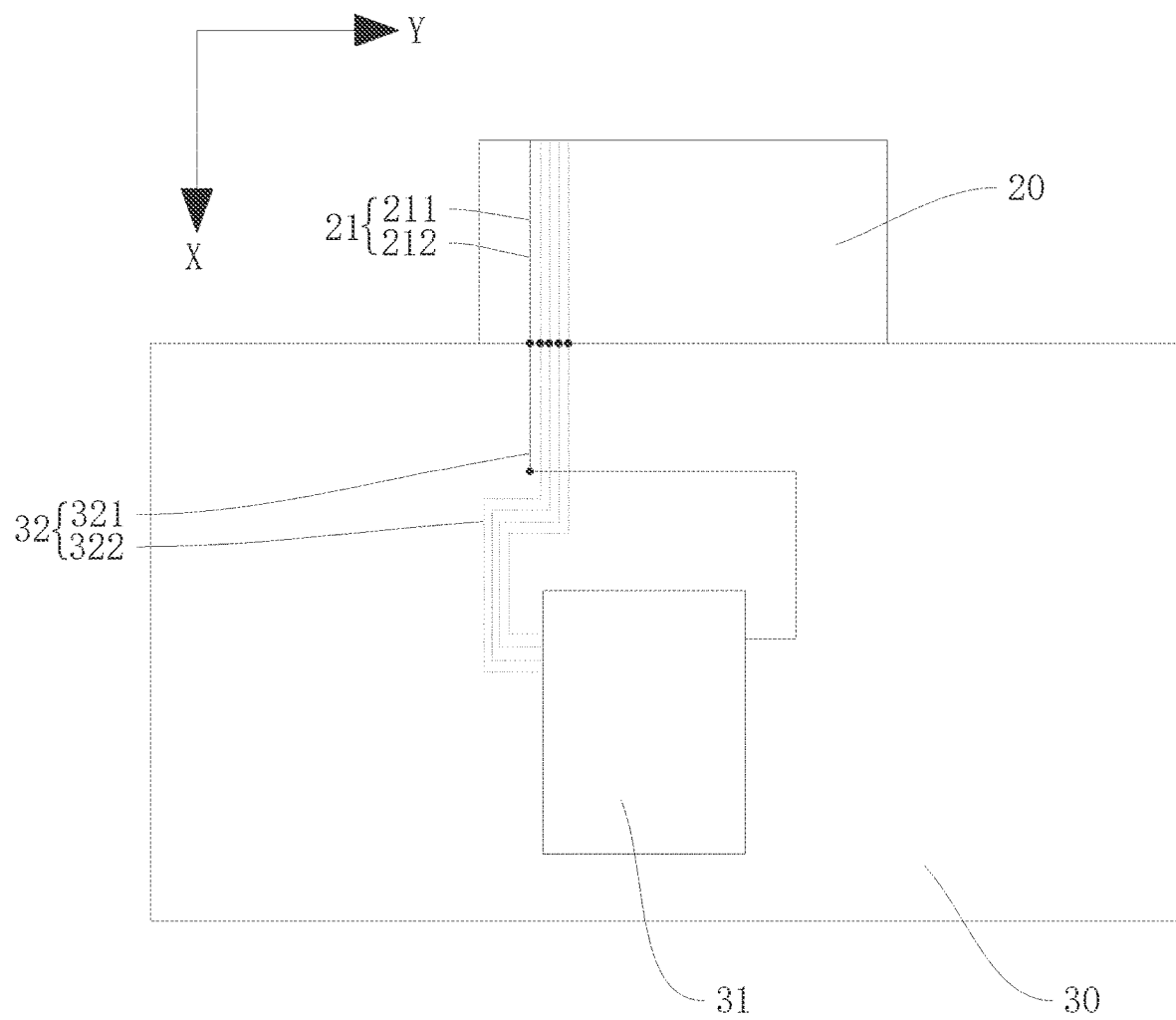
FIG. 7 is a schematic structural view of a wiring layout of another printed circuit board and a flexible wiring board provided by an embodiment of the present application.

In another embodiment of the present application, with reference to FIG. 7, a difference of the present embodiment from the previous embodiment is that n is 1 and m is 4. Namely, the number of the third sections of the first signal lines 321 in each of the first signal line sets is the same, comprising the third section of one first signal line 321, and the number of the third sections of the second signal lines 322 in each of the second signal line sets is the same, comprising the third sections of four second signal lines 322. Furthermore, one of the first signal line sets and one of the second signal line sets are shown in the figure for explanation.

Furthermore, the arrangement of the signal lines 32 on the printed circuit board 30 is different from that of the previous embodiment. The arrangement of the second signal lines 322 is changed, which can prevent intersection of the second sections of the second signal lines 322 on the printed circuit board 30.

Specifically, a distribution of lengths of the first sections, the second sections, and the third sections of the second signal lines 322 during arrangement is as follows. A length of the third section near the first side of the driver chip 31 is greater than a length of the third section away from the first side of the driver chip 31. A length of the second section connected to the third section near the first side of the driver chip 31 is less than a length of the second section connected to the third section away from the first side of the driver chip 31. A length of the first section connected to the third section near the first side of the driver chip 31 is less than a length of the first section connected to the third section away from the first side of the driver chip 31. As such, for the second signal lines 322 with the longer third sections, a total length of the second signal lines 322 and other second signal lines 322 can tend to be consistent by reducing lengths of the first section and the second section such that resistance of each of the second signal lines 322 tends to be consistent to achieve signal transmission.

In the present embodiment, the driver chip 31 is disposed on the printed circuit board 30 such that by adjusting and designing the arrangement of the signal lines 32 on the printed circuit board 30 and transmitting signals into the wires through the flexible wiring board 20, distribution of the wires is no longer restricted due to different signals transmitted on different flexible wiring board 20, which improves flexibility of the arrangement of the wires, and simultaneously achieves an effect of reduction of a frame width of the display panel main body 10 to achieve narrow frame display. Also, changing the arrangement of the second signal lines 322 can prevent intersection of the second signal lines 322 arranged on the printed circuit board to further reduce use of a connection bridge, which reduces processes and costs.

Figure 8:
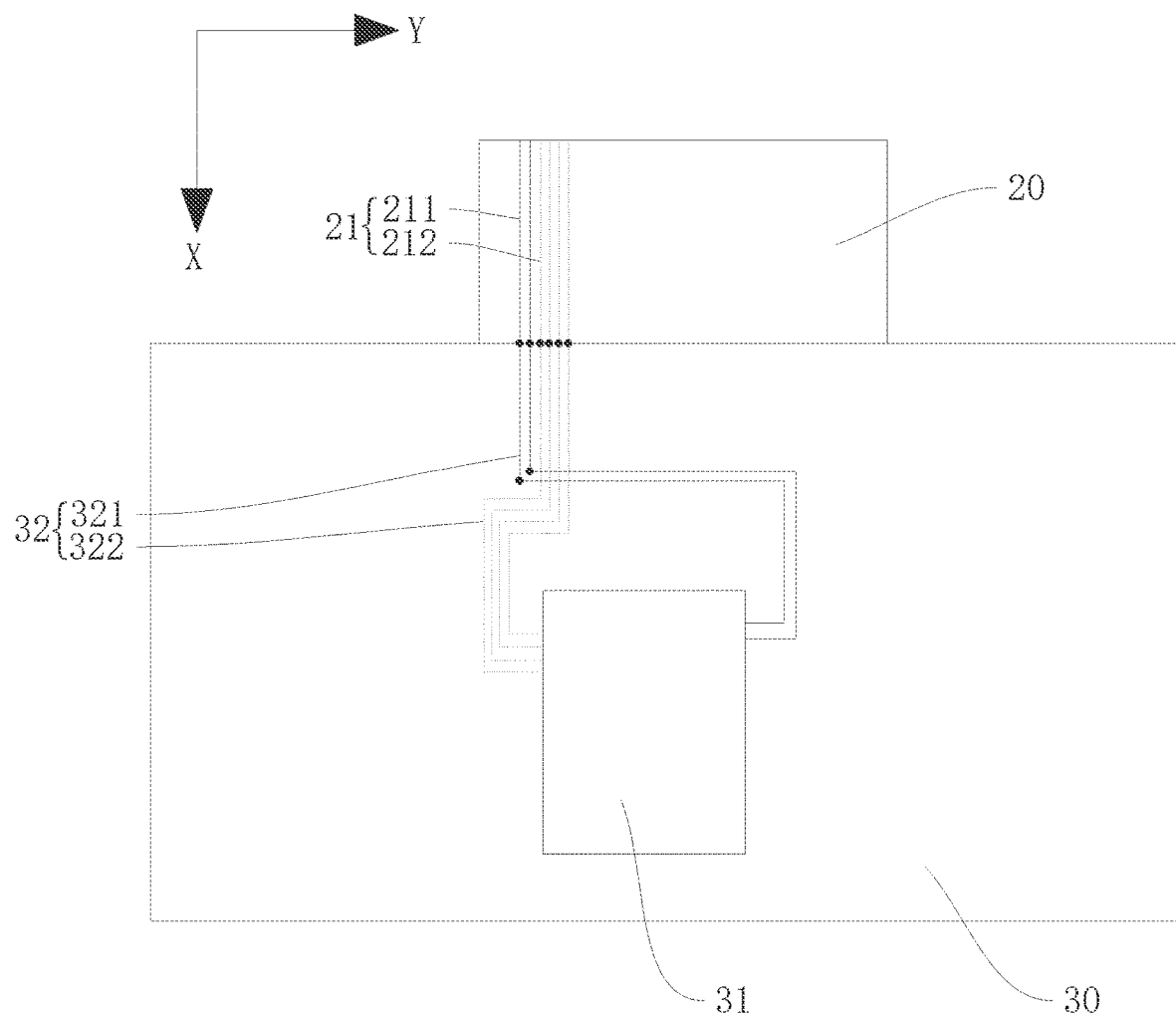
FIG. 8 is a schematic structural view of a wiring layout of another printed circuit board and a flexible wiring board provided by an embodiment of the present application.

In another embodiment of the present application, with reference to FIG. 8, a difference of the present embodiment from the previous embodiment is that, n is 2 and m is 4. Namely, the number of the third sections of the first signal lines 321 in each of the first signal line sets is the same, comprising the third sections of two first signal lines 321, and the number of the third sections of the second signal lines 322 in each of the second signal line sets is the same, comprising the third sections of four second signal lines 322. Furthermore, one first signal line set and one second signal line set are shown in the figure as an example for explanation.

Furthermore, the arrangement of the signal lines 32 on the printed circuit board 30 is the same as that of the previous embodiment, and only adjusts the number of the third sections of the first signal lines 321 in each of the first signal line sets.

In the present embodiment, the driver chip 31 is disposed on the printed circuit board 30 such that by adjusting and designing the arrangement of the signal lines 32 on the printed circuit board 30 and transmitting signals into the wires through the flexible wiring board 20, distribution of the wires is no longer restricted due to different signals transmitted on different flexible wiring board 20, which improves flexibility of the arrangement of the wires, and simultaneously achieves an effect of reduction of a frame width of the display panel main body 10 to achieve narrow frame display. Also, changing the arrangement of the first signal lines 321 and the second signal lines 322 can prevent intersection of the first signal lines 321 and second signal lines 322 arranged on the printed circuit board to further reduce use of a connection bridge, which reduces processes and costs.

Figure 9:
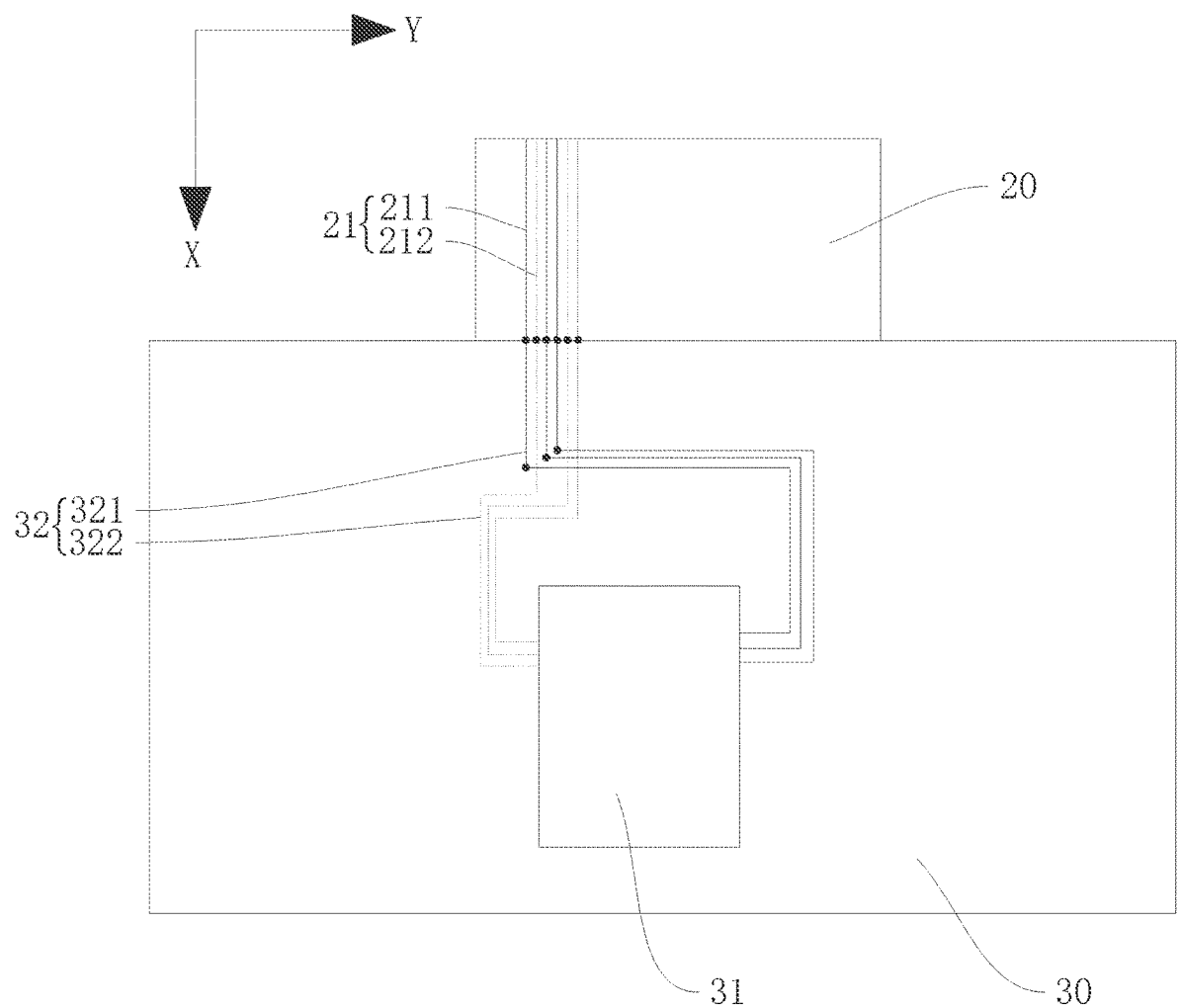
FIG. 9 is a schematic structural view of a wiring layout of another printed circuit board and a flexible wiring board provided by an embodiment of the present application.

In another embodiment of the present application, with reference to FIG. 9, a difference of the present embodiment from the previous embodiment is that the arrangement of the first signal lines 321 and the second signal lines 322 on the printed circuit board 30 is changed. Specifically, a number of the third sections of the first signal lines 321 in the first signal line sets increases along the second direction Y, and the number of the third sections of the second signal lines 322 in the second signal line sets increases along the second direction Y. Namely, the third section of one first signal line 321, the third section of one second signal line 322, the third sections of two first signal lines 321, and the third sections of two second signal lines 322 are included sequentially along the second direction Y and are arranged according to the discipline of increase.

In the present embodiment, the driver chip 31 is disposed on the printed circuit board 30 such that by adjusting and designing the arrangement of the signal lines 32 on the printed circuit board 30 and transmitting signals into the wires through the flexible wiring board 20, distribution of the wires is no longer restricted due to different signals transmitted on different flexible wiring board 20, which improves flexibility of the arrangement of the wires, and simultaneously achieves an effect of reduction of a frame width of the display panel main body 10 to achieve narrow frame display. Also, changing the arrangement of the first signal lines 321 and the second signal lines 322 can prevent intersection of the first signal lines 321 and second signal lines 322 arranged on the printed circuit board to further reduce use of a connection bridge, which reduces processes and costs.

Figure 10:
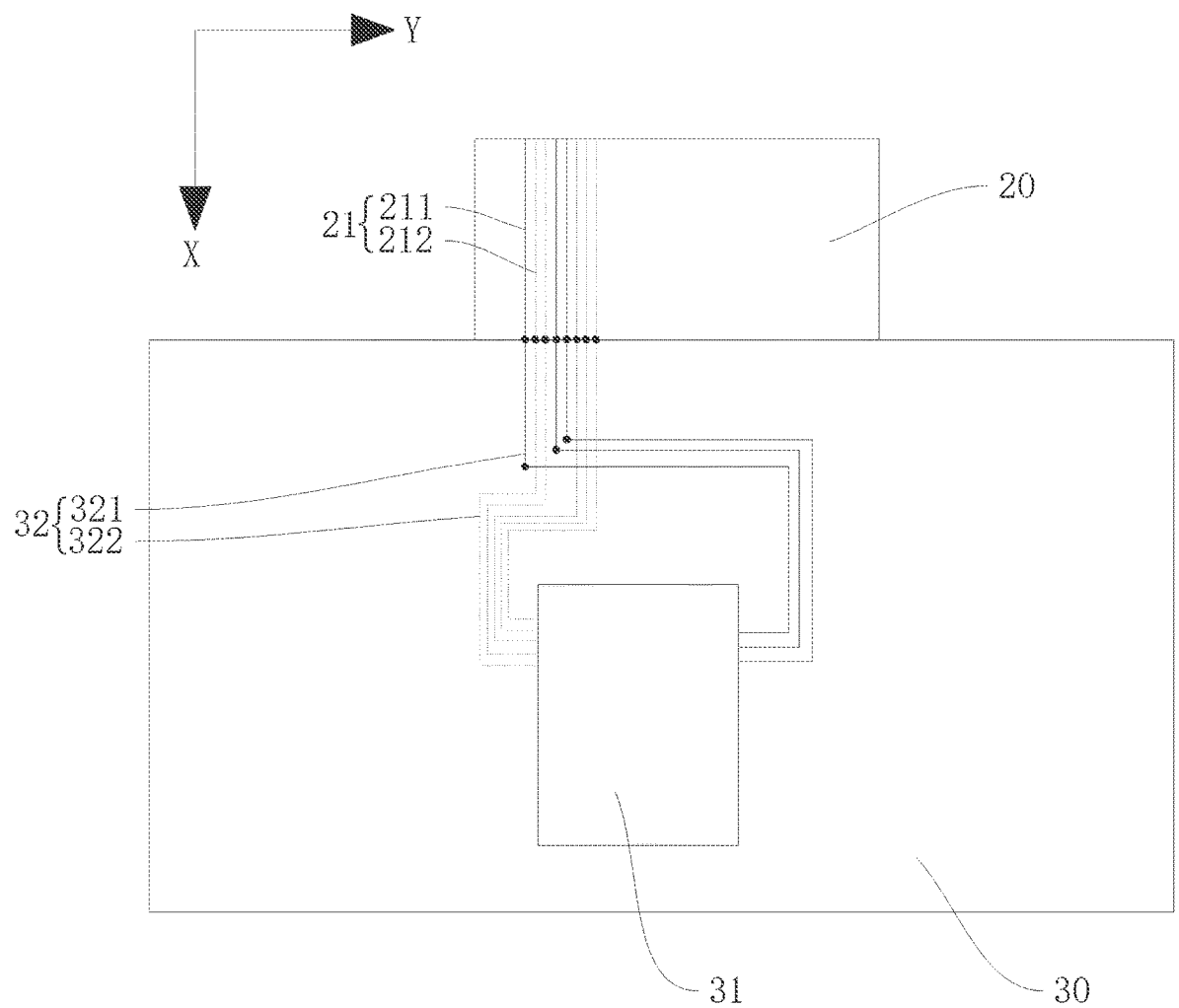
FIG. 10 is a schematic structural view of a wiring layout of another printed circuit board and a flexible wiring board provided by an embodiment of the present application.

In another embodiment of the present application, with reference to FIG. 10, a difference of the present embodiment from the previous embodiment is that the arrangement of the first signal lines 321 and the second signal lines 322 on the printed circuit board 30 are changed. Specifically, the number of the third sections of the first signal lines 321 in the first signal line sets along the second direction Y increases gradually, and the number of the third sections of the second signal lines 322 in the second signal line sets along the second direction Y increases gradually. Namely, the third section of one first signal line 321, the third sections of two second signal lines 322, the third sections of two first signal lines 321, and the third sections of three second signal lines 322 are included and arranged sequentially along the second direction Y according to a discipline of gradual increase.

In the present embodiment, the driver chip 31 is disposed on the printed circuit board 30 such that by adjusting and designing the arrangement of the signal lines 32 on the printed circuit board 30 and transmitting signals into the wires through the flexible wiring board 20, distribution of the wires is no longer restricted due to different signals transmitted on different flexible wiring board 20, which improves flexibility of the arrangement of the wires, and simultaneously achieves an effect of reduction of a frame width of the display panel main body 10 to achieve narrow frame display. Also, changing the arrangement of the first signal lines 321 and the second signal lines 322 can prevent intersection of the first signal lines 321 and second signal lines 322 arranged on the printed circuit board to further reduce use of a connection bridge, which reduces processes and costs.

It should be explained that on the flexible wiring board 20, the first connection lines 211 are connected correspondingly to the first signal lines 321, and the second connection lines 212 are connected correspondingly to the second signal lines 322. Namely, the arrangement of the first connection lines 211 and the second connection lines 212 changes depending on change of the arrangement of the first signal lines 321 and the second signal lines 322. Similarly, the wires are connected to corresponding connection lines, namely, the wiring layout changed depending on the arrangement of the connection lines, which can further control the wiring layout by adjusting the arrangement of the signal lines 32 on the printed circuit board 30 and improves flexibility of the wiring layout.

Furthermore, the arrangement of the signal lines 32 further comprises the gradually decreasing number of the third sections of the first signal lines 321 in the first signal line sets along the second direction Y and the gradually decreasing number of the third sections of the second signal lines in the second signal line sets 322 along the second direction Y, or other irregular arrangement, which is not limited here.

Furthermore, in the embodiment of the present application, the driver chip 31 on the printed circuit board 30 can be plural, or the printed circuit board 30 can be plural and be disposed on a plurality of side edges of the display panel main body 10.

Figure 11:
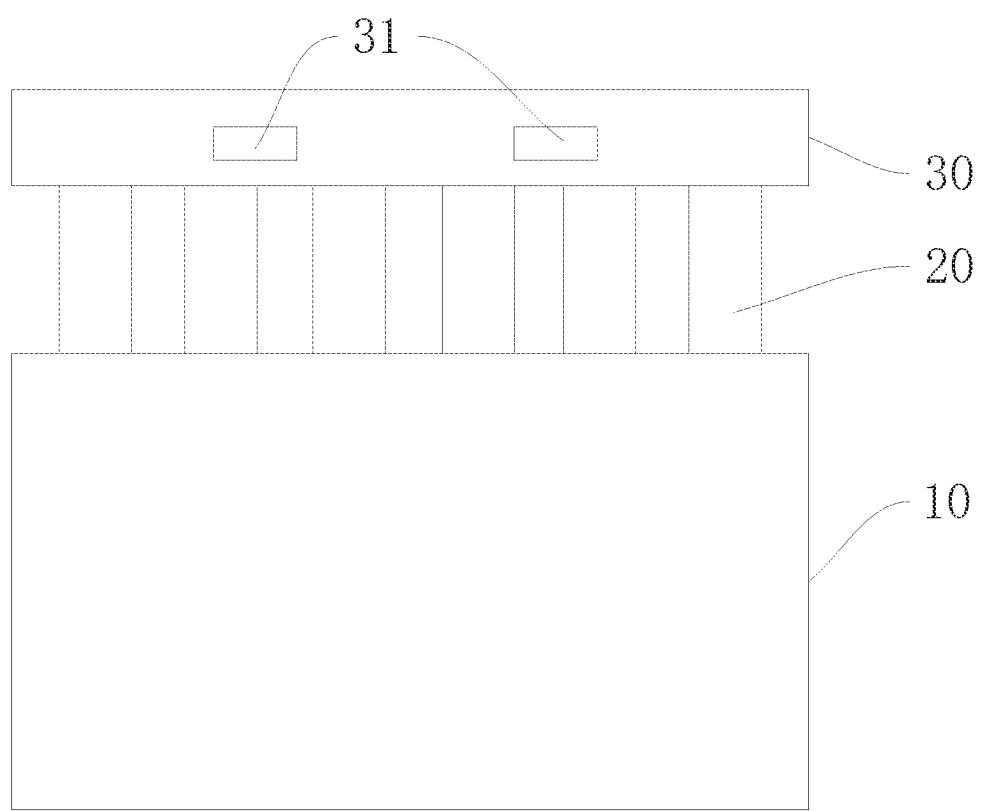
FIG. 11 is a schematic structural view of another display panel provided by an embodiment of the present application.

Specifically, with reference to FIG. 11, two driver chips 31 are disposed on the printed circuit board 30. Similarly, an arrangement of the signal lines can be controlled to adjust the wiring layout method, which is not described repeatedly here.

Figure 12:
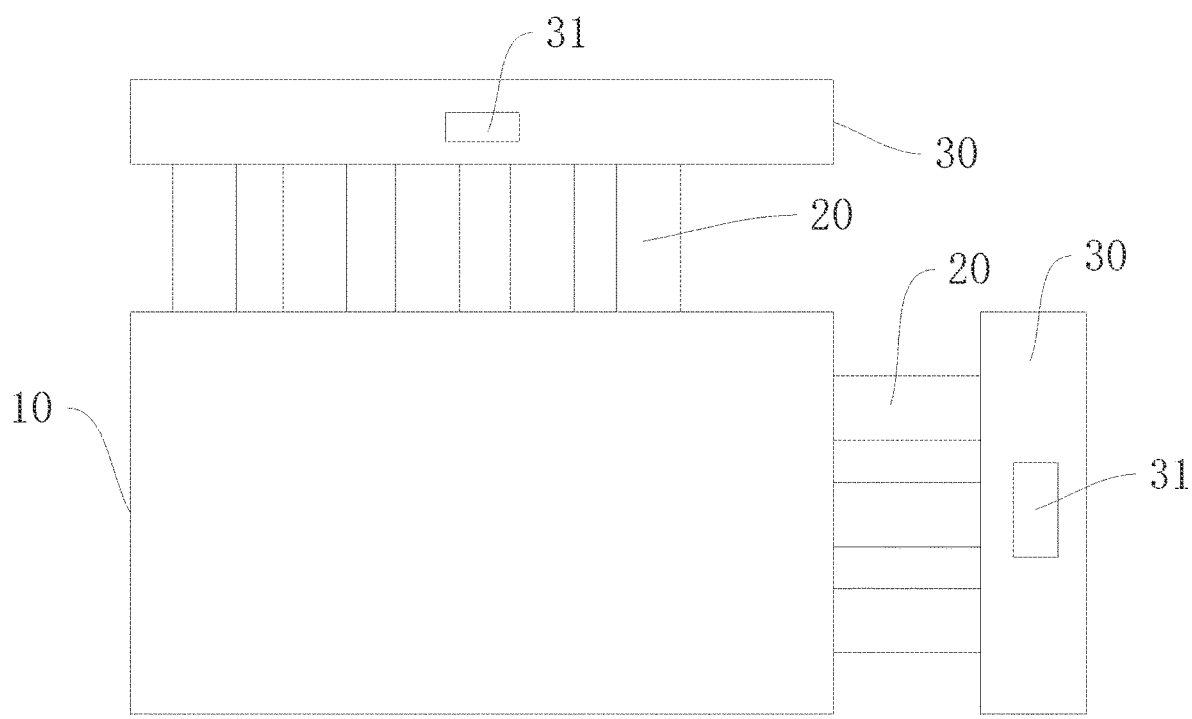
FIG. 12 is a schematic structural view of another display panel provided by an embodiment of the present application.

With reference to FIG. 12, the display panel comprises two printed circuit boards 30 disposed on two sides of the display panel main body 10, respectively, such that a plurality of signals can be output, respectively. For example, one printed circuit board 30 performs inputting scan signals, and the other printed circuit board 30 performs inputting data signals, which is not limited here.

Optionally, the display panel provided by the embodiment of the present application can be directly used for display of a display screen, or for a backlight light board assembly.

It should be explained that the above display panel can bend the flexible wiring board 20 such that the printed circuit board 30 is bent to a rear surface of the display panel main body 10 to further reduce the frame width of the display panel.

Moreover, the embodiment of the present application further provides a display device, and the display device comprises one or a plurality of the display panels in the above embodiments. When including a plurality of display panels, the display device can splice the display panels to achieve large-sized display.

The present application, disposes the driver chip 31 on the printed circuit board 30, connects the driver chip 31 through the signal lines 32, disposes connection lines 21 on the flexible wiring board 20 to connect with the signal lines 32, and connects wires to connection lines 21 to achieve signal transmission. The present application disposes the driver chip 31 on the printed circuit board 30 such that, by adjusting and designing a layout of the signal lines 32 on the printed circuit board 30 and transmitting the signals to the wires through the flexible wiring board 20, distribution of the wires can be no longer restricted due to different signals transmitted on different flexible wiring boards 20, which improves flexibility of the distribution of the wires.

In the above-mentioned embodiments, the descriptions of the various embodiments are focused. For the details of the embodiments not described, reference may be made to the related descriptions of the other embodiments.

The display panel and the display device provided by the embodiment of the present application are described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A display panel, comprising:
a display panel main body, comprising a plurality of wires;
a flexible wiring board, wherein an end of the flexible wiring board is connected to the display panel main body; and
a printed circuit board connected to another end of the flexible wiring board, wherein the printed circuit board comprises a driver chip, and the driver chip is electrically connected to the wires;
wherein the flexible wiring board comprises a plurality of connection lines, the printed circuit board comprises a plurality of signal lines, and each of the connection lines is connected between a corresponding one of the wires and a corresponding one of the signal lines;
wherein the signal lines comprise a plurality of first signal lines and a plurality of second signal lines, the wires comprise a plurality of first wires and a plurality of second wires, each of the first signal lines is connected to a corresponding one of the first wires through a corresponding one of the connection lines, each of the second signal lines is connected to a corresponding one of the second wires through a corresponding one of the connection lines, and a signal of each of the first signal lines is different from a signal of each of the second signal lines;
wherein at least one of the first signal lines or at least one of the second signal lines comprises a first section, a second section, and a third section, the first section is connected between the driver chip and the second section, and the second section is connected between a corresponding one of the connection lines and the first section, and the third section is connected between a corresponding one of the connection lines and the second section;
wherein the first signal lines are connected to a first side of the driver chip, the first sections of the second signal lines are connected to a second side of the driver chip disposed opposite to the first side and are arranged along a first direction, the third sections of the second signal lines are arranged along a second direction, the first direction is a direction pointing from the flexible wiring board to the driver chip, a second direction is a direction pointing from the second side of the driver chip to the first side, and the first direction is perpendicular to the second direction; and
wherein a length of the third section in the second signal lines near the first side is less than a length of the third section in the second signal lines away from the first side, a length of the second section connected to the third section near the first side is greater than a length of the second section connected to the third section away from the first side, and a length of the first section connected to the third section near the first side is greater than a length of the first section connected to the third section away from the first side.

2. The display panel according to claim 1, wherein a plurality of first signal line sets and a plurality of second signal line sets are arranged alternately along the second direction, wherein each of the first signal line sets comprises the third section of at least one of the first signal lines, and each of the second signal line sets comprises the third section of at least one of the second signal lines.

3. The display panel according to claim 2, wherein numbers of the third sections of the first signal lines in the first signal line sets are equal, and numbers of the third sections of the second signal lines in the second signal line sets are equal.

4. The display panel according to claim 2, wherein numbers of the third sections of the first signal lines in the first signal line sets are gradually increased or decreased along the second direction, and numbers of the third sections of the second signal lines in the second signal line sets are gradually increased or decreased along the second direction.

5. A display device, wherein the display device comprises a display panel, and the display panel comprises:
a display panel main body, comprising a plurality of wires;
a flexible wiring board, wherein an end of the flexible wiring board is connected to the display panel main body; and
a printed circuit board connected to another end of the flexible wiring board, wherein the printed circuit board comprises a driver chip, and the driver chip is electrically connected to the wires;
wherein the flexible wiring board comprises a plurality of connection lines, the printed circuit board comprises a plurality of signal lines, and each of the connection lines is connected between a corresponding one of the wires and a corresponding one of the signal lines;
wherein the signal lines comprise a plurality of first signal lines and a plurality of second signal lines, the wires comprise a plurality of first wires and a plurality of second wires, each of the first signal lines is connected to a corresponding one of the first wires through a corresponding one of the connection lines, each of the second signal lines is connected to a corresponding one of the second wires through a corresponding one of the connection lines, and a signal of each of the first signal lines is different from a signal of each of the second signal lines;
wherein at least one of the first signal lines or at least one of the second signal lines comprises a first section, a second section, and a third section, the first section is connected between the driver chip and the second section, and the second section is connected between a corresponding one of the connection lines and the first section, and the third section is connected between a corresponding one of the connection lines and the second section;
wherein the first signal lines are connected to a first side of the driver chip, the first sections of the second signal lines are connected to a second side of the driver chip disposed opposite to the first side and are arranged along a first direction, the third sections of the second signal lines are arranged along a second direction, the first direction is a direction pointing from the flexible wiring board to the driver chip, a second direction is a direction pointing from the second side of the driver chip to the first side, and the first direction is perpendicular to the second direction; and
wherein a length of the third section in the second signal lines near the first side is less than a length of the third section in the second signal lines away from the first side, a length of the second section connected to the third section near the first side is greater than a length of the second section connected to the third section away from the first side, and a length of the first section connected to the third section near the first side is greater than a length of the first section connected to the third section away from the first side.

6. The display device according to claim 5, wherein a plurality of first signal line sets and a plurality of second signal line sets are arranged alternately along the second direction, wherein each of the first signal line sets comprises the third section of at least one of the first signal lines, and each of the second signal line sets comprises the third section of at least one of the second signal lines.

7. The display device according to claim 6, wherein numbers of the third sections of the first signal lines in the first signal line sets are equal, and numbers of the third sections of the second signal lines in the second signal line sets are equal.

8. The display device according to claim 6, wherein numbers of the third sections of the first signal lines in the first signal line sets are gradually increased or decreased along the second direction, and numbers of the third sections of the second signal lines in the second signal line sets are gradually increased or decreased along the second direction.

* * * * *